(12) United States Patent
Gohel et al.

(10) Patent No.: US 11,159,248 B2
(45) Date of Patent: Oct. 26, 2021

(54) OPTICAL RECEIVING DEVICE

(71) Applicant: Teradyne, Inc., North Reading, MA (US)

(72) Inventors: Tushar K. Gohel, Winchester, MA (US); Thomas D. Jacobs, Rochdale, MA (US)

(73) Assignee: TERADYNE, INC., North Reading, MA (US)

( * ) Notice: Subject to any disclaimer, the term of this patent is extended or adjusted under 35 U.S.C. 154(b) by 0 days.

(21) Appl. No.: 16/718,767

(22) Filed: Dec. 18, 2019

(65) Prior Publication Data

US 2021/0194595 A1 Jun. 24, 2021

(51) Int. Cl.
*H04B 10/69* (2013.01)
*H03F 3/189* (2006.01)

(52) U.S. Cl.
CPC ......... *H04B 10/6911* (2013.01); *H03F 3/189* (2013.01); *H04B 10/69* (2013.01); *H04B 10/697* (2013.01); *H03F 2200/105* (2013.01); *H03F 2200/261* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 4,220,412 A | * | 9/1980 | Shroyer | G01J 1/42 250/226 |
| 4,236,256 A | * | 11/1980 | Brackett | H04B 10/695 341/57 |
| 4,885,803 A | * | 12/1989 | Hermann | H04B 1/205 398/112 |
| 5,087,808 A | * | 2/1992 | Reed | G01R 29/26 250/214 A |
| 5,321,849 A | * | 6/1994 | Lemson | H03G 3/3052 398/209 |
| 5,534,996 A | * | 7/1996 | Mori | G01J 1/44 356/218 |
| 5,708,482 A | * | 1/1998 | Takahashi | H04N 5/18 348/257 |
| 6,356,129 B1 | * | 3/2002 | O'Brien | H03K 5/00006 327/156 |
| 6,563,352 B1 | | 5/2003 | Gohel | |

(Continued)

OTHER PUBLICATIONS

"Application Note: Designing with the AOC 10Gbps TOSA and ROSA". Finisar Corporation—Advanced Optical Components Division (2007). 24 pages.

(Continued)

*Primary Examiner* — Li Liu
(74) *Attorney, Agent, or Firm* — Burns & Levinson LLP

(57) ABSTRACT

An example optical receiving device includes a photodiode to receive an optical signal, where the photodiode is configured to conduct a current that is based on an optical power of the optical signal, and a radio frequency (RF) gain circuitry to generate one or more analog electrical signals based on the current and based on gain provided by the RF gain circuitry. A power detector is configured to receive an analog electrical signal of the one or more analog electrical signals, to detect alternating current (AC) power of the optical signal based on the analog electrical signal, and to output a signal representing the AC power based on the detecting.

14 Claims, 8 Drawing Sheets

(56) References Cited

U.S. PATENT DOCUMENTS

| | | |
|---|---|---|
| 6,894,505 B2 | 5/2005 | Gohel |
| 7,395,479 B2 | 7/2008 | Gohel et al. |
| 7,420,375 B2 | 9/2008 | Gohel |
| 8,310,270 B2 | 11/2012 | Gohel et al. |
| 8,988,081 B2 | 3/2015 | Gohel et al. |
| 9,240,774 B2 | 1/2016 | Gohel |
| 10,250,957 B2 | 4/2019 | Gohel et al. |
| 10,404,363 B2 | 9/2019 | Gohel et al. |
| 10,404,364 B2 | 9/2019 | Gohel et al. |
| 2004/0056666 A1 | 3/2004 | Gohel |
| 2004/0253003 A1* | 12/2004 | Farmer ............ H04Q 11/0067 398/214 |
| 2005/0146320 A1 | 7/2005 | Gohel |
| 2005/0193275 A1 | 9/2005 | Gohel |
| 2006/0045459 A1* | 3/2006 | Lalonde ................ G01M 11/00 385/147 |
| 2006/0161827 A1 | 7/2006 | Gohel et al. |
| 2006/0233546 A1 | 10/2006 | Lalonde |
| 2007/0057834 A1* | 3/2007 | Wake ...................... H03M 1/52 341/155 |
| 2008/0187324 A1* | 8/2008 | Akiyama .......... H04B 10/5053 398/188 |
| 2009/0091347 A1 | 4/2009 | Gohel et al. |
| 2011/0141552 A1* | 6/2011 | Ghera ................ H04B 10/2916 359/334 |
| 2012/0106351 A1 | 5/2012 | Gohel et al. |
| 2012/0308240 A1* | 12/2012 | Akiyama ........... H04B 10/5053 398/141 |
| 2013/0106399 A1 | 5/2013 | Gohel et al. |
| 2013/0124134 A1* | 5/2013 | Gohel ...................... H03K 5/01 702/120 |
| 2013/0287392 A1 | 10/2013 | Heimbuch et al. |
| 2014/0023368 A1* | 1/2014 | Bhandare ............... H04J 14/06 398/65 |
| 2015/0155935 A1 | 6/2015 | Oda et al. |
| 2016/0269123 A1* | 9/2016 | Akiyama ......... H04B 10/50577 |
| 2017/0146632 A1* | 5/2017 | Wadell ................. G01R 35/005 |
| 2018/0316420 A1* | 11/2018 | Gohel ................ H04B 10/2589 |
| 2018/0316421 A1 | 11/2018 | Gohel et al. |
| 2018/0316423 A1* | 11/2018 | Gohel ................ H04B 10/0731 |
| 2018/0316424 A1* | 11/2018 | Gohel ................ H04B 10/0731 |
| 2018/0316990 A1* | 11/2018 | Gohel ................ H04B 10/0731 |
| 2019/0020420 A1 | 1/2019 | Zocher |
| 2019/0033372 A1 | 1/2019 | Gohel et al. |
| 2019/0190736 A1* | 6/2019 | Ulm ................... H04L 12/2801 |
| 2020/0209301 A1* | 7/2020 | Karin ................. G01R 31/1272 |

OTHER PUBLICATIONS

International Search Report for International Application No. PCT/US2020/062976, dated Mar. 24, 2021, (3 pages).

Written Opinion for International Application No. PCT/US2020/062976, dated Mar. 24, 2021, (6 pages).

* cited by examiner

OPTICAL RECEIVING DEVICE

TECHNICAL FIELD

This specification relates generally to optical receiving devices.

BACKGROUND

A signal includes informational content and characteristics other than informational content. For example, an optical signal may have an optical power level, which is a measure of the energy delivered by the optical signal per unit of time. Signal characteristics that do not represent the informational content of the signal are referred to as parametric information, and may be represented by data, called parametric data.

SUMMARY

An example optical receiving device includes a photodiode to receive an optical signal, where the photodiode is configured to conduct a current that is based on an optical power of the optical signal, and a radio frequency (RF) gain circuitry to generate one or more analog electrical signals based on the current and based on gain provided by the RF gain circuitry. A power detector is configured to receive an analog electrical signal of the one or more analog electrical signals, to detect alternating current (AC) power of the optical signal based on the analog electrical signal, and to output a signal representing the AC power based on the detecting. The example optical receiving device may include one or more of the following features, either alone or in combination.

The signal output may be a first signal and the optical receiving device may include an amplifier to receive an analog electrical signal of the one or more analog electrical signals, to generate a second signal representing informational content of the analog electrical signal, and to output the second signal. The second signal may be a digital signal. The analog electrical signal received by the power detector may be based on the analog electrical signal received by the amplifier. The analog electrical signal received by the amplifier may be based on the analog electrical signal received by the power detector. The analog electrical signal received by the power detector and the analog electrical signal received by the amplifier may be the same analog electrical signal. The analog electrical signal received by the power detector and the analog electrical signal received by the amplifier may be different analog electrical signals. The different analog electrical signals may be complementary signals. The analog electrical signal received by the power detector and the analog electrical signal received by the amplifier each may be or include a component of a differential signal that is received by both the power detector and the amplifier.

The RF gain circuitry may include a first RF gain circuit and a second RF gain circuit. The first RF gain circuit may be configured to generate a first analog electrical signal of the one or more analog electrical signals. The second RF gain circuit be configured to generate a second analog electrical signal of the one or more analog electrical signals. The analog electrical signal received by the power detector may be based on the first analog electrical signal. The analog electrical signal received by the amplifier may be based on the second analog electrical signal. The first analog electrical signal and the second analog electrical signal may be components of a differential signal. The power detector may be configured to receive the differential signal. The amplifier may be configured to receive the differential signal.

A third RF gain circuit may be in series with the first RF gain circuit. The third RF gain circuit be configured to apply a gain to the first analog electrical signal before the first analog electrical signal is received by the power detector. A fourth RF gain circuit may be in series with the second RF gain circuit. The fourth RF gain circuit may be configured to apply a gain to the second analog electrical signal before the second analog electrical signal is received by the amplifier.

The RF gain circuitry may include a single RF gain circuit. The single RF gain circuit may be configured to generate a single analog electrical signal based on the current. The analog electrical signal received by the power detector may include the single analog electrical signal. The analog electrical signal received by the amplifier may include the single analog electrical signal. A second RF gain circuit may be in series with the single RF gain circuit, the second RF gain circuit to apply a gain to the single analog electrical signal.

The amplifier may be configured to output a differential signal. The differential signal may include the second signal and a third signal. The differential signal may represent the informational content of the analog electrical signal. The second signal and the third signal may represent digital data.

The optical receiving device may include biasing circuitry that is external to the RF gain circuitry to power the RF gain circuitry. The optical receiving device may include a receiver optical sub-assembly (ROSA). The optical receiving device may include an instrumentation amplifier to generate a third signal representing direct current (DC) power based on the current conducted through the photodiode, and to output the third signal. The optical receiving device may include an attenuator between the RF gain circuitry and the power detector. The attenuator may be configured to limit the analog electrical signal received by the power detector to within a predefined range. The AC power of the analog electrical signal may be substantially preserved.

An example optical receiving device includes a photodiode to receive an optical signal, where the photodiode is configured to conduct a current that is based on an optical power of the optical signal; and radio frequency (RF) gain circuitry to generate one or more analog electrical signals based on the current and based on gain provided by the RF gain circuitry. Circuitry is configured to digitize the one or more analog electrical signals and to output, based on a representation of a digitized version of the one or more analog electrical signals, a first signal representing alternating current (AC) power based on the one or more analog electrical signals and a second signal representing informational content of the one or more analog electrical signals. The example optical receiving device may include one or more of the following features, either alone or in combination.

The one or more analog electrical signals may include complementary signals of a differential signal. The optical receiving device may include an instrumentation amplifier to generate a third signal representing direct current (DC) power based on the current conducted through the photodiode, and to output the third signal. The RF gain circuitry may include a first RF gain circuit and a second RF gain circuit. The first RF gain circuit may be configured to generate a first analog electrical signal of the one or more analog electrical signals. The second RF gain circuit may be configured to generate a second analog electrical signal of the one or more analog electrical signals.

An example system includes input circuitry comprising a photodiode to receive an optical signal, where the photodiode is configured to conduct a current that is based on an optical power of the optical signal; and radio frequency (RF) gain circuitry to generate one or more analog electrical signals based on the current and based on gain provided by the RF gain circuitry. The input circuitry also includes circuitry (i) to receive an analog electrical signal of the one or more analog electrical signals, to detect alternating current (AC) power of the optical signal based on the analog electrical signal, and to output a first signal representing the AC power, and (ii) to receive an analog electrical signal of the one or more analog electrical signals, to generate a second signal representing content of the analog electrical signal, and to output the second signal. A first switch is configurable to provide first data based on the first signal to one or more first channels of the system. A second switch is configurable to provide second data based on the second signal to one or more second channels of the system. The example system may include one or more of the following features, either alone or in combination.

The one or more first channels and the one or more second channels may be the same channel. The one or more first channels and the one or more second channels may include different channels. The one or more first channels and the one or more second channels may have one or more constituent channels in common. The one or more first channels may be a first number of channels, the one or more second channels may be a second number of channels, and the first number and the second number may be different numbers.

Any two or more of the features described in this specification, including in this summary section, can be combined to form implementations not specifically described herein.

The systems and techniques described herein, or portions thereof, can be implemented using or controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Figure 1:
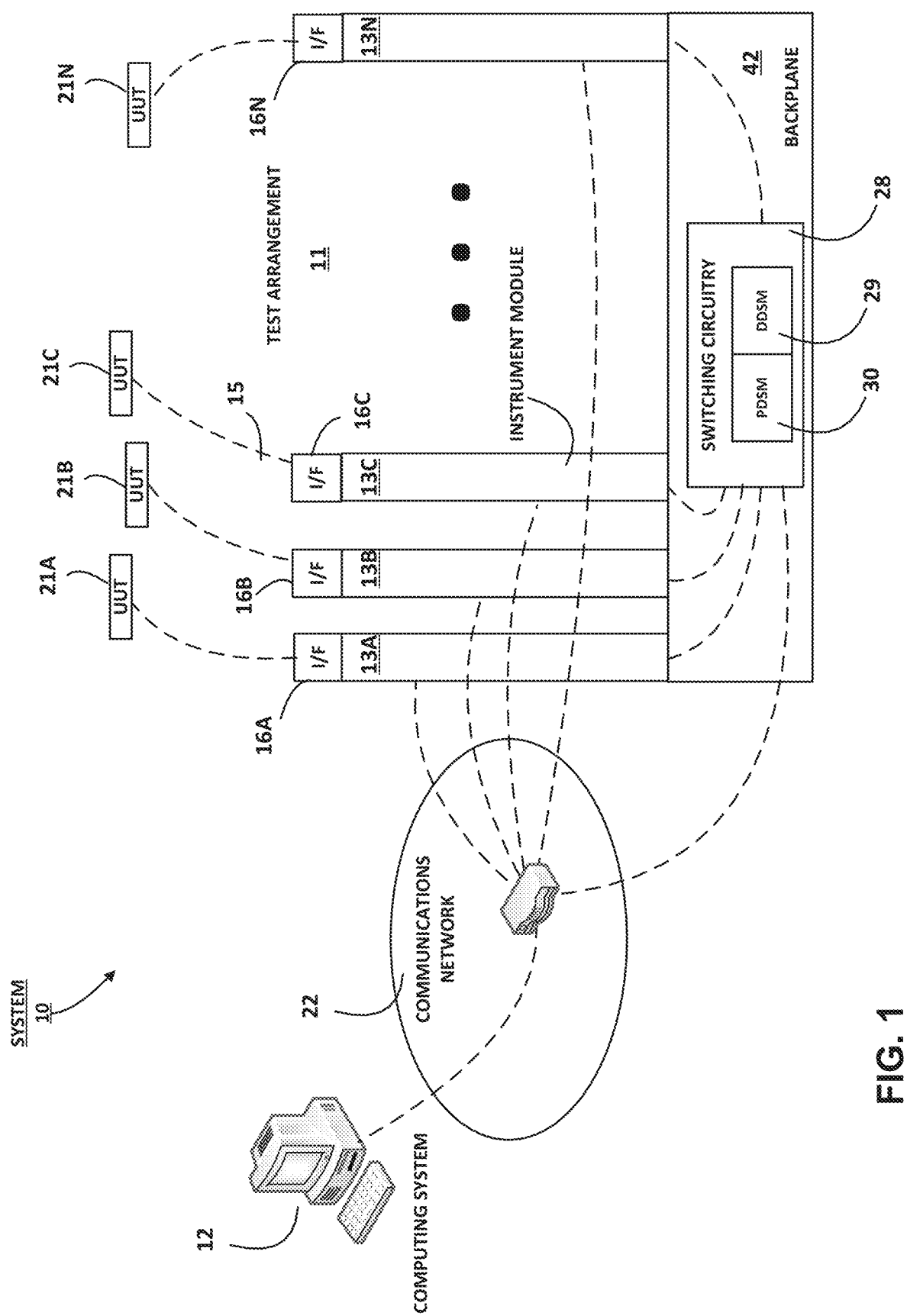
FIG. 1 is a block diagram of components of an example system that incorporates an implementation of the optical receiving device described herein.

Described herein are example systems that include multiple instrument modules. Each of the instrument modules is configured to communicate with one or more devices being tested by the system and also to communicate with other instrument modules that are part of the system. A device being tested is referred to herein as a device under test (DUT) or a unit under test (UUT). Each instrument module is connected to a communication or test channel (or simply, "channel"), over which communications occur. The instrument modules communicate with each other over one or more transmission media on a backplane or other appropriate structure to which the instrument modules interface. For example, the instrument modules may communicate data via one or more serial buses on the backplane or via an Ethernet-based network.

The communication data may include data that represents informational content and data that represents one or more signal characteristics other than informational content. Data that represents the informational content is referred to herein as informational content data. Data that represents one or more signal characteristics other than informational content is referred to herein as parametric data. For example, in some implementations, an instrument module may receive an input signal. The input signal may be optical. The optical signal may represent, for example, test data from a UUT or commands from a host computing system to control testing. The optical signal may be received over one or more optical fibers interfaced to, or otherwise in communication with, the system. The optical signal represents information, as indicated, but also has other characteristics. For example, the optical signal may have an alternating current (AC) optical power level (also referred to as "AC power") and a direct current (DC) optical power level (also referred to as "DC power" or "signal strength"). The instrument module receives the optical signal and converts the optical signal into an electrical signal comprising data representing the informational content of the optical signal—for example, the test data or commands. The instrument module also captures the other characteristics—the parametric information such as AC optical power—associated with the optical signal and generates parametric data representing this parametric information. Both the informational content data and the parametric data may constitute the communication data referred to above and may be transmitted among the instrument modules and associated communication channels.

Instrument modules in the system may be configured to implement pin electronics functionality, such as optical pin electronics. In some implementations, the optical pin electronics are configurable to pass an optical signal to and from the UUT while allowing programmatic control of parametric values of the signals to test the UUT. In this regard, there are various parameters associated with transmitting an optical signal. These parameters include, but are not limited to, AC power level and DC power level. The example optical pin electronics described herein is configured to detect the AC power level and the DC power level of an input optical signal and to output data representing the AC power level and the DC power level as parametric data.

In an example, the optical pin electronics includes an optical receiving device. An example optical receiving device includes a photodiode that receives an input optical signal and that conducts a current that is based on an optical power of the optical signal, radio frequency (RF) gain circuitry that generates an analog electrical signal based on the current and based on gain provided by the RF gain circuitry, and a power detector that receive the analog electrical signal, that detects AC power of the optical signal based on the analog electrical signal, and that outputs a signal representing the AC power. In some implementations, the analog electrical signal is representative of all—for example, 100%—or substantially all of the AC power in the optical signal. Consequently, in some examples, one or more electrical signals representing all or substantially all of the AC power may be sent off of an integrated circuit or chip containing the optical receiving device. The DC power of the optical signal may also be measured and provided for further processing, for example.

Example implementations of automatic test equipment (ATE) having the foregoing capabilities are described herein. ATE refers to an automated, usually computer-driven, system for testing devices. ATE typically includes a computer system and one or more instrument modules as shown in FIG. 1 or a single device having corresponding functionality. In an example operation, in response to instructions in a test program set (TPS), the ATE automatically generates input signals to be applied to a UUT and monitors output signals from the UUT. In some implementations, pin electronics in the ATE, such as the example optical pin electronics described herein, compares one or more features of the received output signals to expected responses or thresholds to determine whether the UUT is defective or has passed a test. For example, the ATE is capable of providing test signals to a UUT, receiving response signals from the UUT, and using or forwarding those response signals for processing to determine whether the UUT meets testing qualifications. Signals are transmitted between the ATE and the UUT over communication channels that may be implemented using fiber optic media. The test and response signals may be processed as described herein to identify their informational and parametric content, to distribute data representing the informational and parametric content, and so forth.

System 10 of FIG. 1 includes a test arrangement 11 and a host computing system 12. Test arrangement 11 may include interfaces (11F) to one or more UUTs 21A to 21N on which tests are performed. Host computing system 12 communicates with components of the test arrangement to control testing. For example, host computing system 12 may download TPSs to instrument modules 13A to 13N in the test arrangement. The instrument modules then run the TPSs to test UUTs in communication with the instrument modules. Host computing system 12 may also send, to instrument modules in the test arrangement, instructions, test data, and/or other information that is usable by the corresponding instrument module to perform appropriate tests on a UUT interfaced thereto. In some implementations, this information may be sent via a computer network or other type of network 22. In some implementations, the foregoing information may be sent via an optical network comprised of fiber optic media that transmit optical signals between the instrument modules and the computer. Conversions between optical and electrical signals may be performed by interface circuitry, such as optical pin electronics, in the respective instrument modules as described herein. In some implementations, the foregoing information may be sent using electrical signals via a computer network, such as a local area network (LAN) or a wide area network (WAN).

Host computing system 12 may configure switching circuitry 28—which may include a digital data switch matrix (DDSM) 29 and a parametric data switch matrix (PDSM) 30 in this example—based on user-provided or other programmatic inputs. The DDSM is configured to provide or to distribute, to various instrument modules or communication channels, data that represents the informational content of an original signal; that is, the informational content data. The PDSM is configured to provide or to distribute, to various instrument modules/communication channels, parametric data representing one or more signal characteristics other than the informational content. Programming data may specify switch configurations within the DDSM and the PDSM or other appropriate operations or configurations, including which ports should receive digital or parametric data. The DDSM and PDSM may be programmed and reprogrammed in real-time, as appropriate.

In some implementations, the DDSM is implemented using a cross-point switch matrix and, in some implementations, the PDSM is implemented using an FPGA. In some implementations, the DDSM is implemented using a cross-point switch matrix that receives and forwards data without performing any processing on the data and, in some implementations, the PDSM is implemented using an FPGA that receives and forwards data and is also capable of performing processing on the data. However, hardware other than that described herein may be used to implement the DDSM and the PDSM.

In the example of FIG. 1, system 10 includes instrument modules 13A to 13N, each of which may be configured to perform one or more of the functions described herein. Although only four instrument modules are depicted, the system may include any appropriate number of instrument modules, including those residing outside of test arrangement 11. Each instrument module has corresponding interface (I/F) circuitry 16A to 16N for outputting signals to, and receiving signals from, a corresponding UUT, In some implementations, each instrument module may be configured to output test signals to test a UUT based, for example, on TPSs provided by the host computing system and to receive signals from the UUT. Different instrument modules may be configured to perform different tests and/or be configured to test different UUTs. The signals received may include response signals that are based on the test signals and/or signals that originate from the UUT that are not prompted by, or are not in response to, test signals. In some implementations, there are optical connections between the UUT and the instrument module interfaces, in which case the test data and response signals are sent optically. In some implementations, there may be direct fiber optic lines or links between the UUTs and the interfaces, over which optical signals are transmissible. In some implementations, there may be an optical network between the UUTs and the interfaces, over which optical signals are transmissible.

Each instrument module may include an input circuit, such as optical pin electronics, that includes an optical receiving device. The input circuit may be part of I/F circuitry 16A to 16N and may be for receiving signals from one or more UUTs or other signal source(s). In some implementations, each instance of the input circuit is configured to receive an optical signal, configured to convert the optical signal to an electrical signal comprising informational content data, configured to obtain parametric information about the optical signal such as AC and DC optical power before, during, or after the conversion process, and configured to generate parametric data based on the parametric information. In an example, the parametric information may be measured by the input circuit and converted to analog or to digital data by the input circuit or appropriate logic external to the interface circuit. Each instrument module may also include an output circuit, which may be part of I/F circuitry 16A to 16N, for outputting signals to a communication channel. In some implementations, the I/F circuitry may be implemented using a device, such as a field-programmable gate array (FPGA), an application-specific integrated circuit (ASIC), or other appropriate hardware. In some implementations, the I/F circuitry of one or more of the instrument modules may include one or more optical receiving devices that are designed to support 850 nanometers (nm) multi-mode optical communication from 1 Gb/s to 12 Gb/s or higher. In some implementations, other types of optical interfaces may be used.

The instrument modules 13A to 13N may be interconnected through backplane 42 or any other appropriate electrical or mechanical mechanism. For example, instrument modules 13A to 13N may mechanically interface to—for example, plug into—backplane 42. Backplane 42 may include one or more transmission media over which communications pass among the various instrument modules. For example, the transmission media may be, or include, one or more serial buses such as a peripheral component interconnect express (PCIe) bus, Ethernet cable, or other appropriate electrical or optical transmission media Communications among the instrument modules pass through switching circuitry 28 which, as described herein, includes one or more programmable switching matrices in some implementations. Switching circuitry 28 is configurable to receive informational content data and parametric data, and to distribute the informational content data and parametric data among the instrument modules. As explained, informational content data received from an instrument module may be provided to one or more of the same communication channels or to one or more different communication channels. Parametric data received from an instrument module may be provided to one or more of the same communication channels or to one or more different communication channels. In some implementations, some of the informational content data may be sent to one set of channels and some of the parametric data may be sent to another set of channels, with the first and second sets overlapping, at least in part. In some implementations, the informational content data and the parametric data may be sent to different numbers of channels or to the same number of channels. Basically, any routing that is appropriate may be implemented. In some implementations, instrument modules may receive data from the switching circuitry, manipulate that data, and send the data back to the switching circuitry via one or more other instrument modules.

A separate processing device, such as a hardware processing device that may or may not reside on the backplane, may perform processing before, during, or after distribution implemented by the switches. In some implementations, processing may be directed by, or under control of, host computing system 12. In some implementations, the processing may be performed in the instrument modules.

Figure 2:
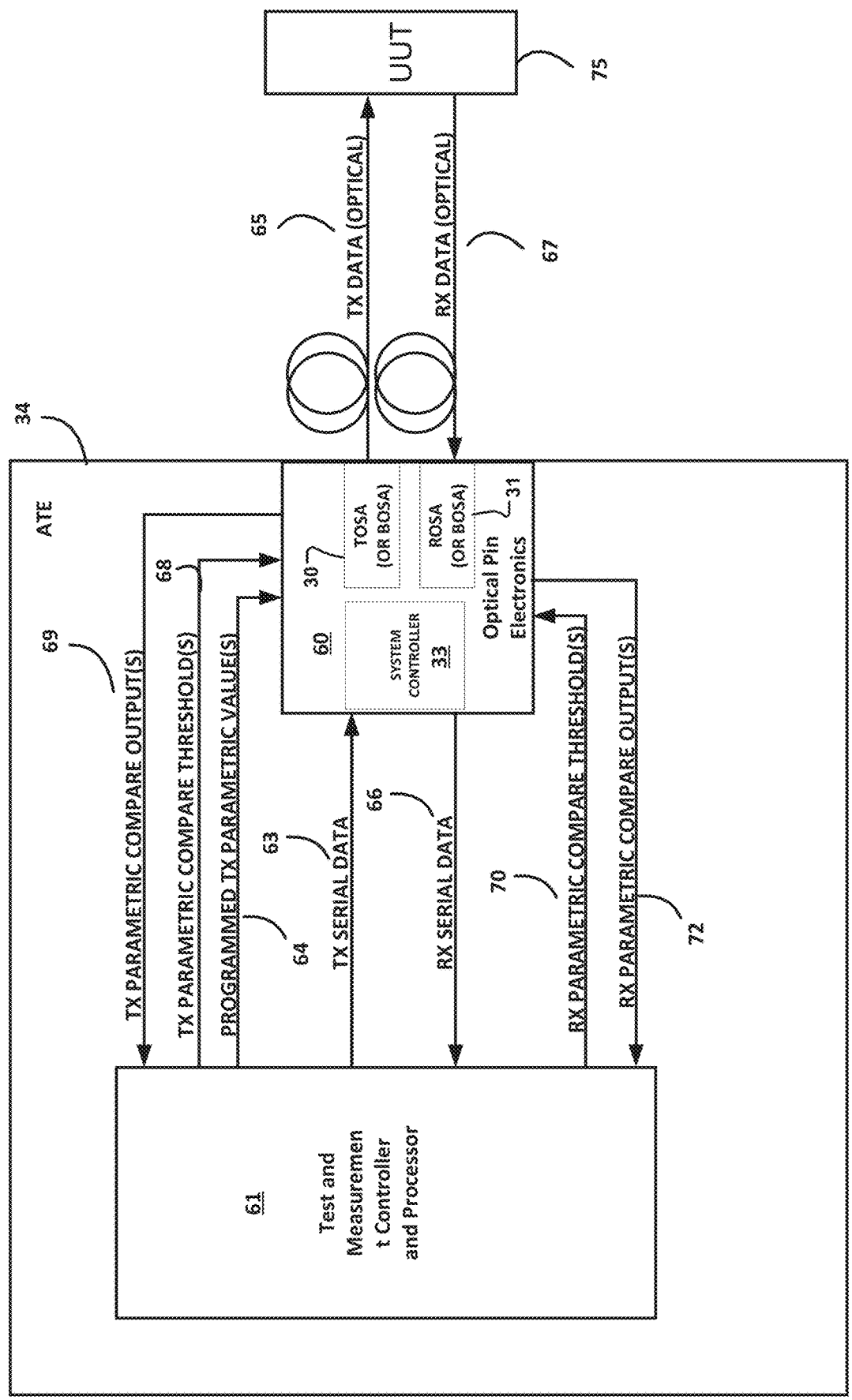
FIG. 2 is a block diagram of components of example automatic test equipment that includes an implementation of the optical receiving device.

As noted, each instrument module may include a separate interface 16A to 16N, such as an optical interface, that connects, through one or more optical transmission media, directly to a UUT. FIG. 2 shows an example implementation of components of optical pin electronics 60 implemented on an interface, such as interface 16A, in ATE 34. Optical pin electronics 60 communicates with test and measurement control processor ("processor") 61. Processor 61 may be, or include, any appropriate processing device or combination of devices described herein. For example, processor 61 may be part of an instrument module. In some implementations, processor 61 is programmed or otherwise configured, among other things, to output test signals to a UUT (not shown) and to receive signals from the UUT in order to interpret test results. Test signals and response signals pass through optical pin electronics 60.

In some implementations, optical pin electronics 60 includes an optical transmitting device that includes a transmitter optical sub-assembly (TOSA) 30 and an optical receiving device that includes a receiver optical sub-assembly (ROSA) 31. In some implementations, the interface includes a bi-directional optical sub-assembly (BOSA) (not shown), which implements both the transmit function of a TOSA and the receive function of a ROSA. Any appropriate interface that converts optical signals to electrical signals, and vice versa, may be used.

An example ROSA includes a photodiode configured to receive an optical signal directly from an optical transmission medium such as fiber optic cable. The photodiode produces a current signal when exposed to the optical signal that is proportional to an optical power of the optical signal. An RF gain circuit, such as a power amplifier, on the ROSA detects the current signal and amplifies the current signal to produce an output signal that is sent off-chip for processing, as described below. An example TOSA is configured to convert an electrical signal into an optical signal and to output the optical signal to an optical transmission medium, such as fiber optic cable. In some implementations, the TOSA produces an optical signal and passes the optical signal to an optical transmission medium. An example BOSA includes the preceding components of both a TOSA and of a ROSA. The BOSA also includes a wavelength division multiplexer to enable bidirectional transmission and to support two wavelengths on each optical fiber. In some implementations, optical transmission media may be connected to a device, such as UUT 75, which transmits signals such as test response signals to, and receives signals such as test data from, optical pin electronics 60.

FIGS. 3 to 8 show example implementations of optical receiving devices that may be used in the optical pin electronics. In FIGS. 3 to 8, the optical receiving devices include a ROSA and associated circuitry. In some implementations, the ROSA includes a single integrated circuit (IC) or chip and the associated circuitry is off-chip. In some implementations, the ROSA includes multiple ICs.

Figure 3:
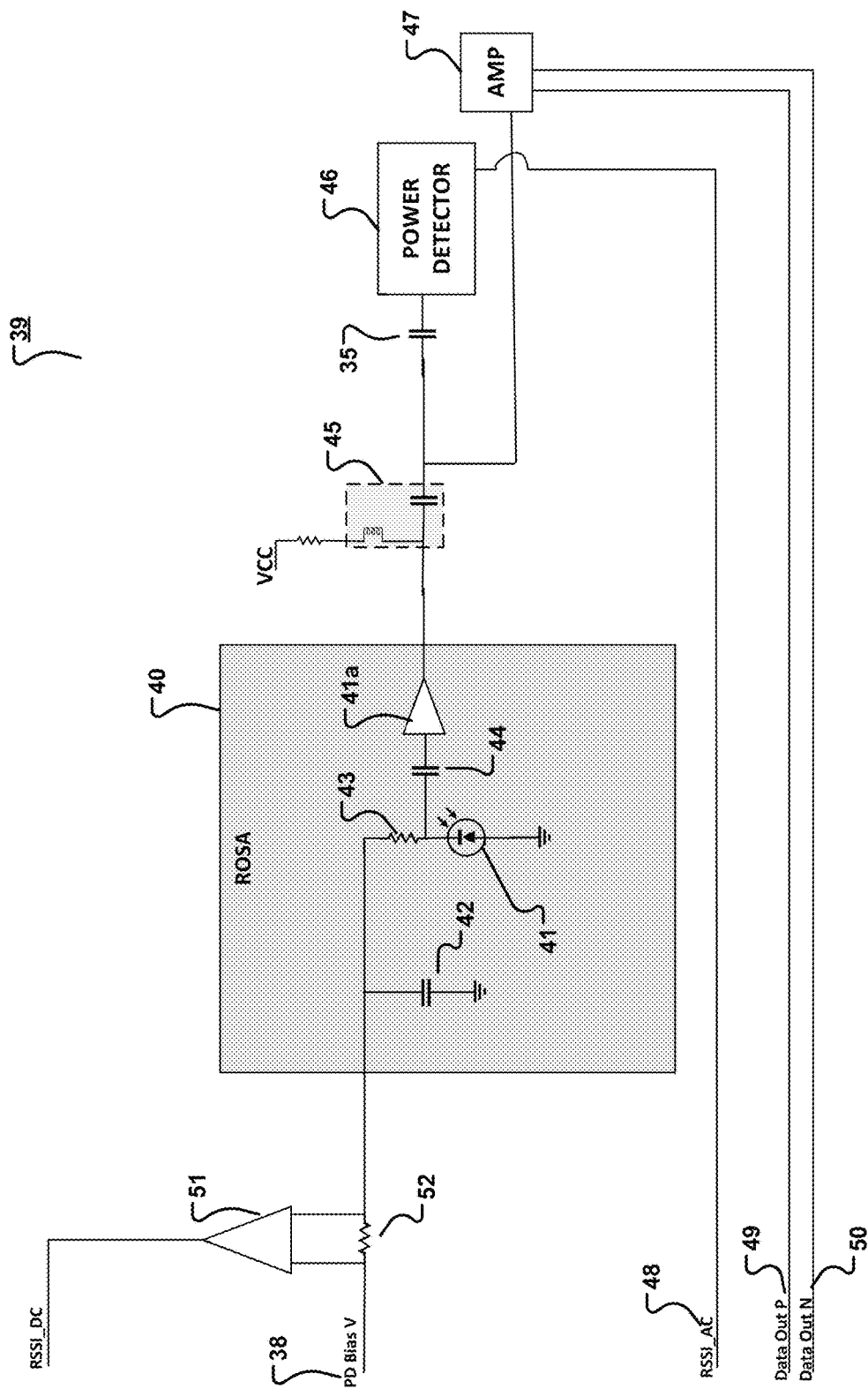
FIGS. 3, 4, 5, 6, 7, and 8 are block diagrams that show examples of different implementations of the optical receiving device.

In the example of FIG. 3, optical receiving device 39 includes ROSA 40. ROSA 40 includes photodiode 41 to receive an optical signal from an optical transmission medium and to conduct a current that is based on an optical power of the optical signal. Photodiode 41 may be an avalanche photodiode. An example avalanche photodiode is a semiconductor electronic device that exploits the photoelectric effect to convert light to electricity. The optical transmission medium is orthogonal to the page and not shown. The optical signal may be received directly from the optical transmission medium so that the photodiode receives all or substantially all of the optical power of the optical signal. The current conducted by the photodiode may be proportional or otherwise related to the optical power. ROSA 40 also includes RF gain circuitry to generate one or more analog electrical signals based on the current and based on gain inherent in the RF gain circuitry. The RF gain circuitry may include an RF gain circuit, an example of which is a power amplifier 41a, to amplify the current signal produced by the photodiode to produce an analog electrical signal that is based on the current signal. Capacitor 42 is used to filter high-frequency signals in a bias voltage 38 provided to the photodiode. Resistors 43 is a pull-up resistor and capacitor 44 is a coupling capacitor to prevent DC signals from reaching the input of the power amplifier. Circuitry 45 biases the power amplifier. In this example, the output of the power amplifier is an analog signal that represents the AC power and informational content of the optical signal detected by photodiode 41. This analog signal is provided to power detector 46 and limiting amplifier (AMP) 47.

Power detector 46 may be a logarithmic power detector that is configured to generate a signal that is proportional to the decibel level of the input optical signal. More specifically, power detector 46 is configured to receive the analog electrical signal and to detect the AC power of the optical signal based on the analog electrical signal. Capacitor 35 may filter low-frequency signals. Power detector 46 outputs a signal 48 representing the AC power of the optical signal. The signal may be a received signal strength indicator (RSSI) signal and may be analog or digital.

Limiting amplifier 47 is configured to receive the analog electrical signal from the power amplifier, to generate a one or more signals representing informational content of the analog electrical signal, and to output those signals. Since the analog electrical signals is representative of the optical signal received by the photodiode, the informational content of the analog electrical signal represents the informational content of the optical signal. In this example, amplifier 47 outputs complementary digital signals (P 49 and N 50), each of which represents the digital content of the optical signal. The complementary digital signals constitute a differential signal. In some implementations, amplifier 47 may be configured to output a single digital signal—that is, a non-differential signal—representing the informational content of the optical signal.

In some implementations, there may be an attenuator circuit or simply "an attenuator" between circuitry 45 and power detector 46. The attenuator may be configured to change a range of power levels represented by the analog electrical signal. That is, the attenuator may shift the range to one that is supported by the power detector. In some implementations, there may be an attenuator between circuitry 45 and limiting amplifier 47. The attenuator here and in the other examples provided with respect to FIGS. 4 to 8 may not be included in the circuitry.

Instrumentation amplifier 51 measures the DC power of the optical signal by measuring the current across resistor 52. The DC power of the optical signal is output as an analog electrical signal.

In the example of FIG. 3, the same signal is output from power amplifier 41a to both power detector 46 and limiting amplifier 47. In some implementations, different signals for example, complementary signals may be output from power amplifier 41a to both power detector 46 and limiting amplifier 57, as described below. In some implementations, the electrical signal received by the power detector is based on the analog electrical signal received by the amplifier. For example, the analog electrical signal received by the power detector may be a modified version of the analog electrical signal received by the amplifier. In some implementations, the analog electrical signal received by the amplifier is based on the analog electrical signal received by the power detector. For example, the analog electrical signal received by the amplifier may be a modified version of the analog electrical signal received by the power detector.

Figure 4:
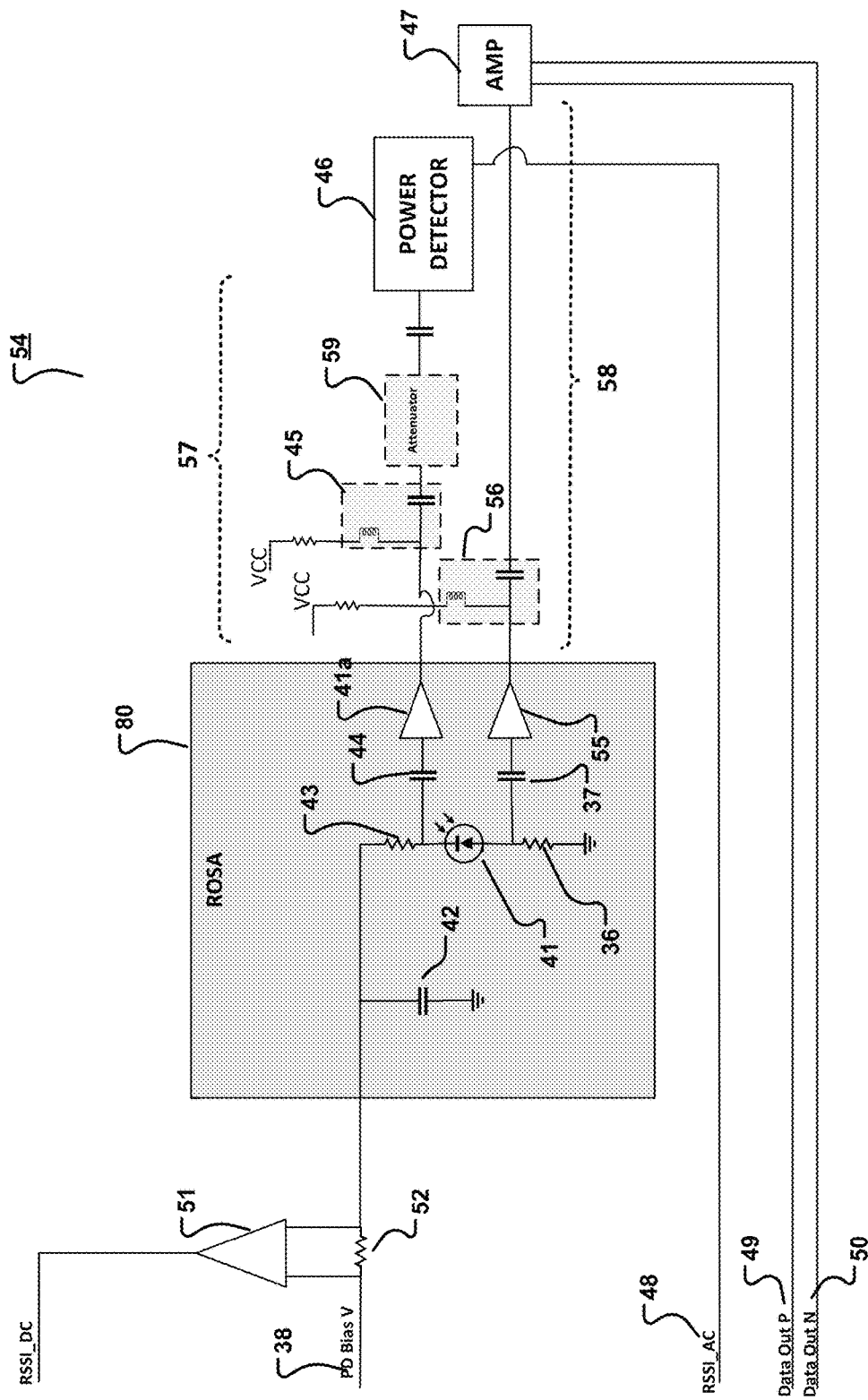

In the example of FIG. 4, there are two separate signal paths to output complementary—for example, differential—signals representing the AC power of the optical signal received by the photodiode. In this example, the structure and function of the components common to FIGS. 3 and 4 are similar or substantially the same. However, in this optical receiving device 54, a second power amplifier 55 generates a second analog electrical signal that is complementary to the analog electrical signal generated by first power amplifier 41a. Circuitry 56 biases this second power amplifier. In addition, a resistor 36 and capacitor 37 are connected as shown. In this example, both analog electrical signals individually represent the optical power and informational content of the optical signal received by the photodiode, but are out-of-phase by 180°. The signal output from power amplifier 41a proceeds through path 57, where power detector 46 detects the AC optical power based on that signal and outputs an electrical signal 48 representing the AC optical power. The signal output from power amplifier 55 proceeds through path 58, where limiting amplifier 47 detects the informational content of that signal and outputs complementary digital signals 49, 40 representing that informational content. The remaining functionality of optical receiving device 54, including the optional attenuator 59, is as described with respect to FIG. 3.

Figure 5:
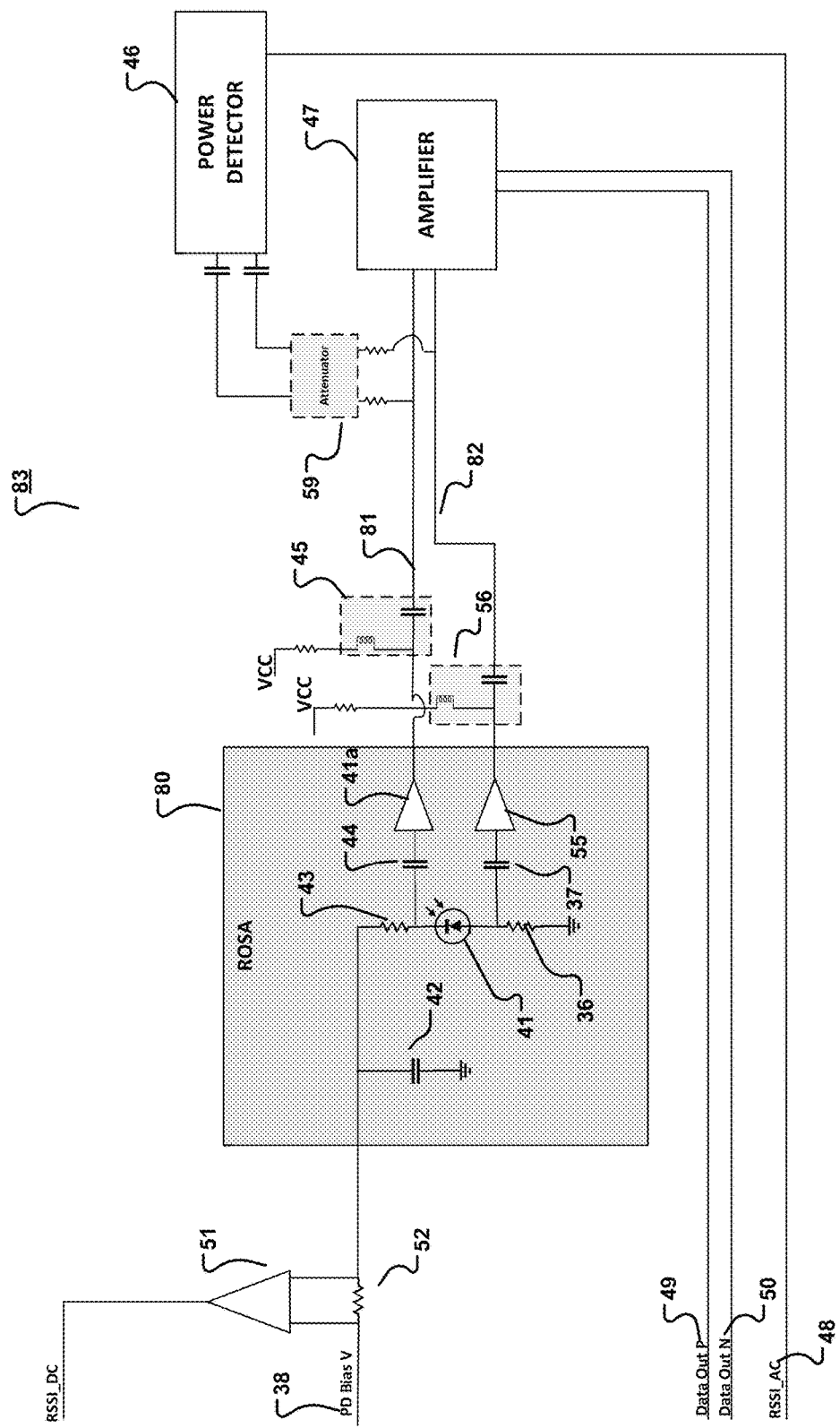

In the example of FIG. 5, the components of ROSA 80 are the same as in ROSA 80 of FIG. 4. However, the complementary—for example, differential—signals 81, 82, output by power amplifiers 41a, 55 are both provided to power detector 46 and limiting amplifier 47. In this example, power detector 46 detects the AC optical power based on both complementary signals and outputs electrical signal 48 representing the AC optical power. In this example, limiting amplifier 47 detects the information content based on both complementary signals and outputs complementary digital signals 49, 50 representing that informational content. The remaining functionality of optical receiving device 83 of FIG. 5 is as described with respect to FIG. 4.

Figure 6:
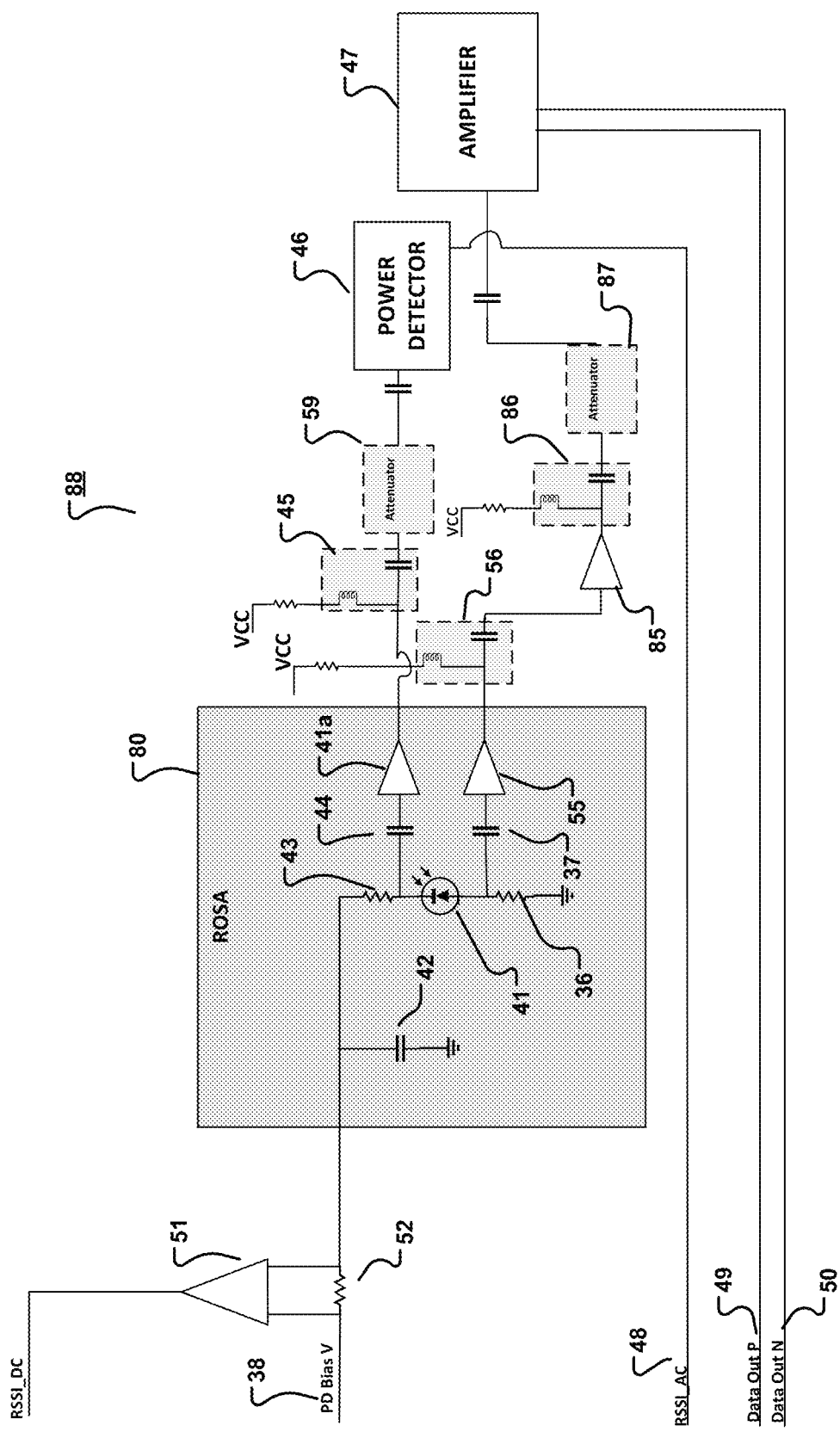

In the example of FIG. 6, the components of ROSA 80 are the same as in the example of FIG. 4. The circuitry is otherwise the same as well except that there is an additional power amplifier 85 in the signal path to limiting amplifier 47. Also, there is additional biasing circuitry 86. This additional power amplifier 86 may increase the strength of the signal to a strength that can be detected by the limiting amplifier 47. In addition, as shown, optional attenuators 59, 87 may be placed along both circuit paths to shift a range of power levels represented by the signals. The remaining functionality of optical receiving device 88 of FIG. 6 is as described with respect to FIG. 4.

Figure 7:
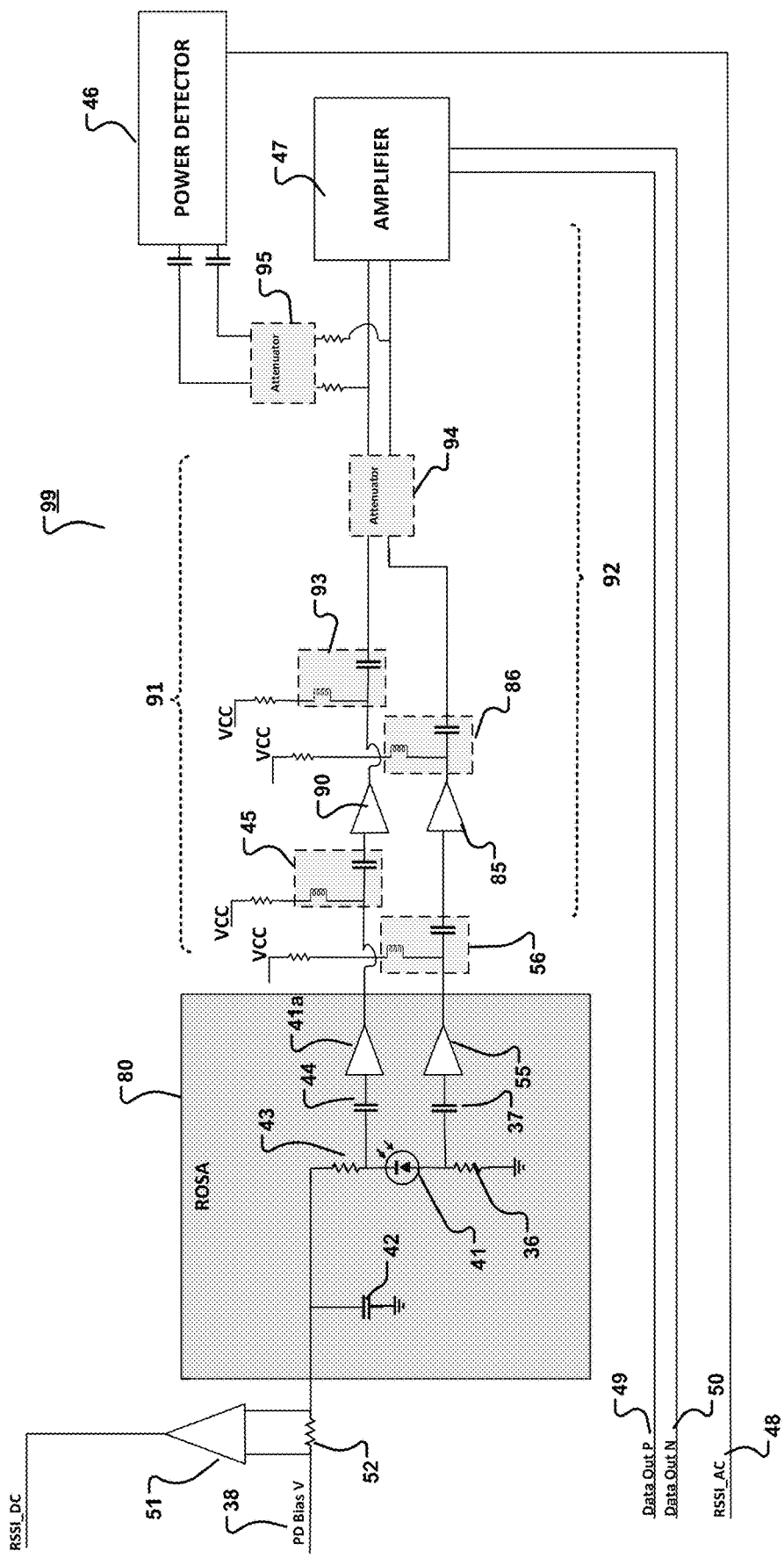

In the example of FIG. 7, the components of ROSA 80 are the same as in the example of FIG. 5. The circuitry is otherwise the same as well except that there is an additional power amplifier 85 and 90 in each signal path 91 and 92, along with respective biasing circuits 86 and 93. The additional power amplifiers may be used to increase the signal strength along each signal path. In addition, optional attenuators 94 and 95 may be included along both signal paths. The remaining functionality of optical receiving device 99 of FIG. 7 is as described with respect to FIG. 5.

Figure 8:
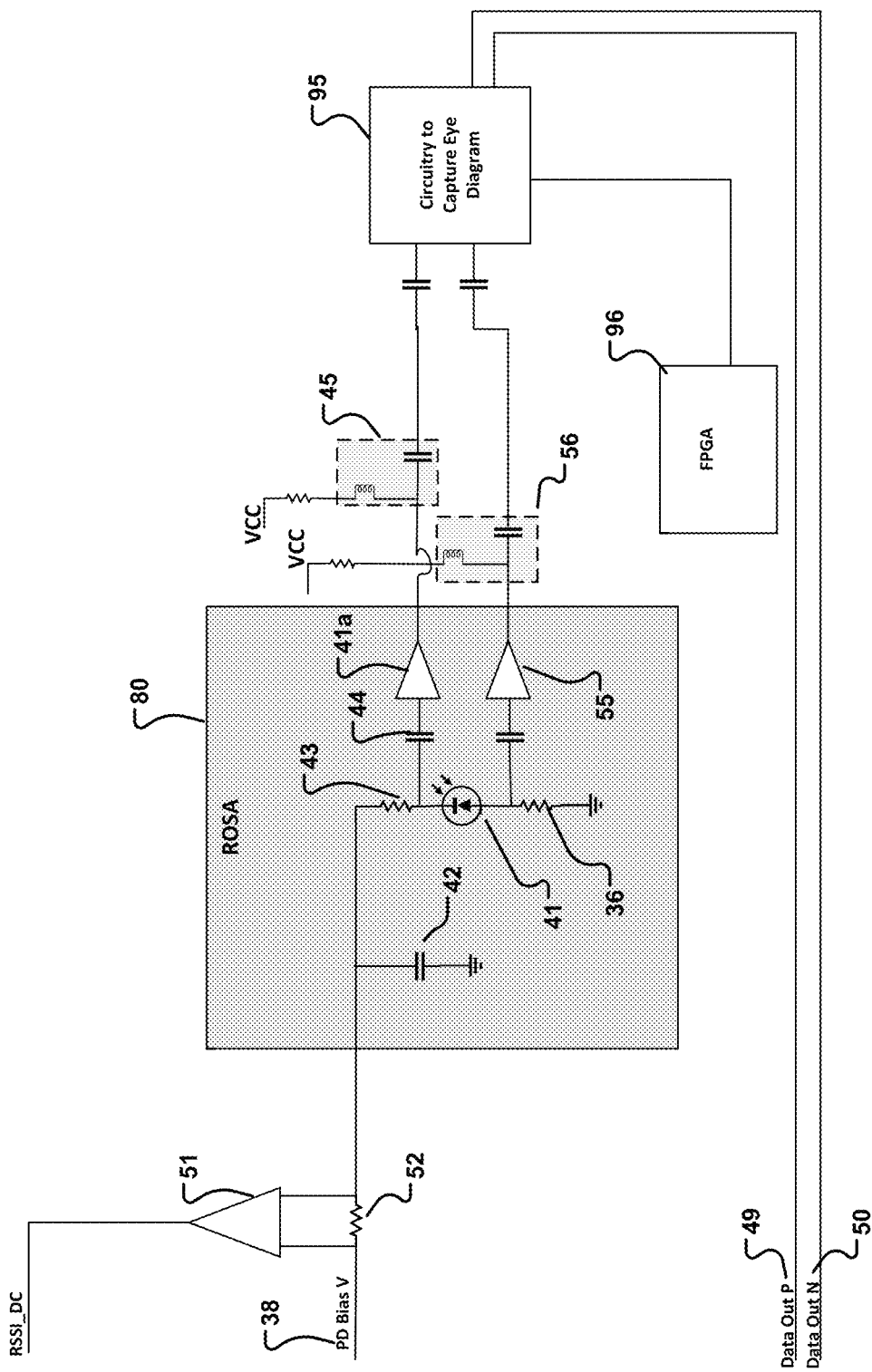

The example implementation of FIG. 8 has a configuration similar to that of FIG. 4. However, instead of a power detector and limiting amplifier, the analog electrical signals output by the power amplifiers of the ROSA are provided to circuitry 95 for capturing an eye diagram based on the analog electrical signals. The eye diagram includes parametric information about the signals—in this example, AC power. In an example, an eye diagram includes a display in which an electrical signal received from the ROSA is repetitively sampled and applied to a vertical input, while the data rate of the sampling is used to trigger a horizontal sweep. The resulting pattern is a representation of a digitized version of the electrical signal and resembles one or more open eyes. The eye diagram may be used to determine the AC power of the optical signal represented by the complementary electrical signals output by ROSA 80. The circuitry may also be used to determine the informational content of those signals and to output digital data 49, 50 representative thereof. In this example, the digital data is differential; however, that is not a requirement. An FPGA 96 or other appropriate control circuitry may be used to for analysis of the eye diagram produced by circuitry 95.

An optical receiving device having the functionality described herein is not limited to the configurations shown in FIGS. 4 to 8. Furthermore, different features of the optical receiving devices of FIGS. 4 to 8 may be combined to produce optical receiving device implementations not specifically described herein.

Referring back to FIG. 2, optical pin electronics 60 also includes a system controller 33. System controller 33 is configured to adjust, or define, parametric information that affects generation of an output optical signal. In some examples, the system controller may be part of a hardware processor (e.g., an FPGA) or may be under control of the host processing system. In some implementations, the optical receiving device and the system controller constitute components of control circuitry that are controllable to adjust, or define, parametric information that represents an input optical signal. For example, the system controller may issue commands included with parametric data to adjust or define parametric data for the input optical signal. The ROSA may generate one or more electrical signals representing parameters defined by that parametric data and having informational content defined by the input optical signal.

In some implementations, optical pin electronics 60 also includes comparison circuitry such as multiple comparators (not shown). The comparators may be implemented in discrete components or digitally-implemented using programmable logic, such as an FPGA. The comparison circuitry is configured to obtain parametric data representing parametric information of either the received optical signal or the output optical signal, and to use that data to compare the parametric information to one or more predefined, programmable thresholds. For example, each comparator may be configured to compare received parametric information to a different threshold.

In some implementations, there may be sets of comparators and thresholds for each different type of parametric information. For example, there may be sets of comparators and thresholds to measure AC optical power and DC optical power based on an electrical signals output from an optical receiving device such as those described with respect to FIGS. 4 to 8. In some implementations, different comparators and corresponding thresholds may be used to measure different parameters including, but not limited to, signal-to-noise ratio, optical modulation amplitude, extinction ratio, ratio, wavelength, rise time, fall time, and/or slew rate. In some implementations, a UUT may be specified to operate between parameters A and B, such as within a particular signal amplitude.

The foregoing comparison results may be interpreted as test results. For example, if the optical signal power of a signal is within a range bounded by two thresholds, as determined from the comparisons, the optical signal may be deemed to be acceptable and thereby pass a test. By contrast, if the optical signal power of a signal is outside a range bounded by two threshold, as determined from the comparisons, the optical signal may be deemed to be unacceptable (e.g., the optical power may be too low for a particular application) and thereby fail a test. In some implementations, the comparison results may be transmitted to system controller 33, which interprets those results, e.g., as pass or fail test results. System controller may also be configured to control, and to adjust, the thresholds that are used by the comparators. The threshold may be adjusted independently for each comparator, providing flexibility in the system. In some implementations, system controller 33 may be implemented in programmable hardware, such as an FPGA or an ASIC. In some implementations, system controller 33 may be, or include, a computing system.

In some implementations, the average optical power of each received optical signal is constantly monitored and compared, using the comparison circuitry, to valid power level(s) (threshold(s)) programmed into the system by a user. Thus, the user can designate minimum and maximum acceptable power levels during operation and obtain pass/fail information from the system during the test. For example, if the optical signal power of a signal is within a range bounded by two thresholds, the optical signal may be deemed to be acceptable and thereby pass a test. By contrast, if the optical signal power of a signal is outside a range bounded by two thresholds, the optical signal may be deemed to be unacceptable and thereby fail a test.

In the example of FIG. 2, processor 61 is configured to output serial data 63 ("TX SERIAL DATA"), which is comprised of electrical signals in this example. Serial data 63 constitutes the informational content of the signals to be output to a UUT 75. Processor 61 is configured to provide programmed parametric value(s) 64 ("PROGRAMMED TX PARAMETRIC VALUE(S)"), which are comprised of electrical signals in this example. Programmed parametric value (s) 64 constitute the non-informational content of the signals to be output to the UUT 75. In this example, optical pin electronics 60 processes serial data 63 and programmed parametric value(s) 64 to generate optical data 65 ("TX DATA (OPTICAL)") for output to a UUT 75. In some implementations, the optical data 65 has the informational content of serial data 63 and the non-informational content of programmed parametric value(s) 64.

As described previously, parametric information from transmitted signals is measured by optical pin electronics 60 and, in this case, the comparison results 69 are provided to processor 61. To this end, processor 61 provides comparator threshold(s) 68 ("TX PARAMETRIC COMPARE THRESHOLD(S)") for comparators that are included in the optical pin electronics. The comparator thresholds 68 are usable by optical pin electronics 60 for comparison against parametric information of output optical data 65 ("TX DATA (OPTICAL)"), as described previously. The comparison results are provided to processor 61. In some implementations, the parametric information itself is also provided to the processor. The comparison results may be used to indicate whether the output signal has appropriate parametrics.

As described previously, parametric information from received signals is measured by optical pin electronics 60 and, in this case, the comparison results 72 are provided to processor 61. To this end, processor 61 provides comparator threshold(s) 70 ("RX PARAMETRIC COMPARE THRESHOLD(S)") for comparators included in the optical pin electronics. The comparator thresholds 70 are usable by optical pin electronics 60 for comparison against parametric information of received optical data 67 ("RX DATA (OPTICAL)"). The comparison results are provided to processor 61. In some implementations, the parametric information such as AC optical power measurements and DC optical power measurements is also provided to the processor. The comparison results may be used to indicate whether a UUT has passed or failed a particular test, for example, Optical pin electronics 50 also provides to processor 61 serial data 66 ("RX SERIAL DATA"), which is comprised of electrical signals representing the informational content of the received optical data.

Testing performed using the example systems described herein may be implemented using hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The techniques described herein may be performed by systems or any other appropriate computing device. The techniques can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" or "optical connection" as used herein may imply a direct physical connection or a wired or wireless connection that includes or does not include intervening components but that nevertheless allows signals to flow between connected components. Any "connection" involving electrical circuitry or optical components mentioned herein that allows signals to flow between two points, unless stated otherwise, is not necessarily a direct physical connection regardless of whether the word "electrical" or "optical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. An optical receiving device comprising:
a photodiode to receive an optical signal, the photodiode to conduct a current that is based on an optical power of the optical signal;
radio frequency (RF) gain circuitry to generate analog electrical signals based on the current and based on gain provided by the RF gain circuitry;
a power detector to receive an analog electrical signal of the analog electrical signals, to detect alternating current (AC) power of the optical signal based on the analog electrical signal, and to output a signal representing the AC power based on the detecting, the signal that is output comprising a first signal; and
an amplifier to receive an analog electrical signal of the analog electrical signals, to generate a second signal representing informational content of the analog electrical signal received by the amplifier, and to output the second signal;
wherein the analog electrical signal received by the power detector and the analog electrical signal received by the amplifier are different analog electrical signals, the different analog electrical signals being complementary signals.

2. An optical receiving device comprising:
a photodiode to receive an optical signal, the photodiode to conduct a current that is based on an optical power of the optical signal;
radio frequency (RF) gain circuitry to generate one or more analog electrical signals based on the current and based on gain provided by the RF gain circuitry;
a power detector to receive an analog electrical signal of the one or more analog electrical signals, to detect alternating current (AC) power of the optical signal based on the analog electrical signal, and to output a signal representing the AC power based on the detecting, the signal that is output comprising a first signal; and
an amplifier to receive an analog electrical signal of the one or more analog electrical signals, to generate a second signal representing informational content of the analog electrical signal received by the amplifier, and to output the second signal;
wherein the analog electrical signal received by the power detector and the analog electrical signal received by the amplifier each comprises a component of a differential signal that is received by both the power detector and the amplifier.

3. An optical receiving device comprising:
a photodiode to receive an optical signal, the photodiode to conduct a current that is based on an optical power of the optical signal;
radio frequency (RF) gain circuitry to generate one or more analog electrical signals based on the current and based on gain provided by the RF gain circuitry;

a power detector to receive an analog electrical signal of the one or more analog electrical signals, to detect alternating current (AC) power of the optical signal based on the analog electrical signal, and to output a signal representing the AC power based on the detecting, the signal that is output comprising a first signal; and an amplifier to receive an analog electrical signal of the one or more analog electrical signals, to generate a second signal representing informational content of the analog electrical signal received by the amplifier, and to output the second signal;

wherein the RF gain circuitry comprises a first RF gain circuit and a second RF gain circuit, the first RF gain circuit to generate a first analog electrical signal of the one or more analog electrical signals, the second RF gain circuit to generate a second analog electrical signal of the one or more analog electrical signals;

wherein the analog electrical signal received by the power detector is based on the first analog electrical signal; and wherein the analog electrical signal received by the amplifier is based on the second analog electrical signal.

4. The optical receiving device of claim 3, further comprising:

a third RF gain circuit in series with the first RF gain circuit, the third RF gain circuit to apply a gain to the first analog electrical signal before the first analog electrical signal is received by the power detector; and a fourth RF gain circuit in series with the second RF gain circuit, the fourth RF gain circuit to apply a gain to the second analog electrical signal before the second analog electrical signal is received by the amplifier.

5. An optical receiving device comprising:

a photodiode to receive an optical signal, the photodiode to conduct a current that is based on an optical power of the optical signal;

radio frequency (RF) gain circuitry to generate one or more analog electrical signals based on the current and based on gain provided by the RF gain circuitry;

a power detector to receive an analog electrical signal of the one or more analog electrical signals, to detect alternating current (AC) power of the optical signal based on the analog electrical signal, and to output a signal representing the AC power based on the detecting, the signal that is output comprising a first signal; and an amplifier to receive an analog electrical signal of the one or more analog electrical signals, to generate a second signal representing informational content of the analog electrical signal received by the amplifier, and to output the second signal;

wherein the RF gain circuitry comprises a first RF gain circuit and a second RF gain circuit, the first RF gain circuit to generate a first analog electrical signal of the one or more analog electrical signals, the second RF gain circuit to generate a second analog electrical signal of the one or more analog electrical signals;

wherein the first analog electrical signal and the second analog electrical signal comprise components of a differential signal;

wherein the analog electrical signal received by the power detector comprises at least part of the differential signal; and wherein the analog electrical signal received by the amplifier comprises at least part of the differential signal.

6. The optical receiving device of claim 5, further comprising:

a third RF gain circuit in series with the first RF gain circuit, the third RF gain circuit to apply a gain to the first analog electrical signal; and a fourth RF gain circuit in series with the second RF gain circuit, the fourth RF gain circuit to apply a gain to the second analog electrical signal.

7. An optical receiving device comprising:

a photodiode to receive an optical signal, the photodiode to conduct a current that is based on an optical power of the optical signal;

radio frequency (RF) gain circuitry to generate one or more analog electrical signals based on the current and based on gain provided by the RF gain circuitry; and circuitry to digitize the one or more analog electrical signals and to output, based on a representation of a digitized version of the one or more analog electrical signals, a first signal representing alternating current (AC) power based on the one or more analog electrical signals and a second signal representing informational content of the one or more analog electrical signals;

wherein the RF gain circuitry comprises a first RF gain circuit and a second RF gain circuit, the first RF gain circuit to generate a first analog electrical signal of the one or more analog electrical signals, the second RF gain circuit to generate a second analog electrical signal of the one or more analog electrical signals.

8. The optical receiving device of claim 7, wherein the one or more analog electrical signals comprise complementary signals of a differential signal.

9. The optical receiving device of claim 7, further comprising:

an instrumentation amplifier to generate third signal representing direct current (DC) power based on the current conducted through the photodiode, and to output the third signal.

10. A system comprising:

input circuitry comprising:

a photodiode to receive an optical signal, the photodiode to conduct a current that is based on an optical power of the optical signal;

radio frequency (RF) gain circuitry to generate one or more analog electrical signals based on the current and based on gain provided by the RF gain circuitry; and circuitry (i) to receive an analog electrical signal of the one or more analog electrical signals, to detect alternating current (AC) power of the optical signal based on the analog electrical signal, and to output a first signal representing the AC power, and (ii) to receive an analog electrical signal of the one or more analog electrical signals, to generate a second signal representing informational content of the analog electrical signal, and to output the second signal;

wherein the RF gain circuitry comprises a first RF gain circuit and a second RF gain circuit, the first RF gain circuit to generate a first analog electrical signal of the one or more analog electrical signals, the second RF gain circuit to generate a second analog electrical signal of the one or more analog electrical signals;

a first switch that is configurable to provide first data based on the first signal to one or more first channels of the system; and a second switch that is configurable to provide second data based on the second signal to one or more second channels of the system.

11. The system of claim 10, wherein the one or more first channels and the one or more second channels are the same channel.

12. The system of claim 10, wherein the one or more first channels and the one or more second channels are different channels.

13. The system of claim 10, wherein the one or more first channels and the one or more second channels have one or more constituent channels in common.

14. The system of claim 10, wherein the one or more first channels is a first number of channels, the one or more second channels is a second number of channels, and the first number and the second number are different numbers.

* * * * *